United States Patent

Khandekar et al.

Patent Number: 5,873,119
Date of Patent: Feb. 16, 1999

[54] METHOD FOR PARALLEL PROCESSING OF DRAM READ REQUEST IN A MEMORY-CACHE CONTROLLER SYSTEM

[75] Inventors: Narendra S. Khandekar, Folsom; Vincent E. Von Bokern, Rescue, both of Calif.

[73] Assignee: Intel Corporation, Santa Clara, Calif.

[21] Appl. No.: 598,794

[22] Filed: Feb. 9, 1996

[51] Int. Cl.[6] .................................................. G06F 12/02
[52] U.S. Cl. ........................... 711/169; 395/309; 711/168
[58] Field of Search ..................................... 395/495, 496, 395/428, 432, 484, 485, 486, 382, 383, 389, 391, 309; 711/168, 169, 105, 157, 158, 159; 365/230.03

[56] References Cited

U.S. PATENT DOCUMENTS

| | | | |
|---|---|---|---|
| 4,916,604 | 4/1990 | Yamamoto et al. | 395/457 |
| 5,367,494 | 11/1994 | Shebanow | 365/230.03 |
| 5,448,703 | 9/1995 | Amini et al. | 395/290 |
| 5,548,786 | 8/1996 | Amini et al. | 395/842 |
| 5,553,256 | 9/1996 | Fetterman et al. | 395/393 |
| 5,557,768 | 9/1996 | Braceras et al. | 395/458 |
| 5,574,876 | 11/1996 | Uchiyama et al. | 711/5 |
| 5,603,007 | 2/1997 | Yazdy et al. | 395/467 |

*Primary Examiner*—Tod R. Swann
*Assistant Examiner*—Hiep T. Nguyen
*Attorney, Agent, or Firm*—Blakely, Sokoloff, Taylor & Zafman

[57] ABSTRACT

A syncDRAM memory interface is provided that is capable of extending data burst during a data transfer in a syncDRAM memory so as to provide a continuous draw of data from the syncDRAM memory banks. Included in the interface is a pipeline request path configured to receive pipeline request data from a microprocessor, a pipeline command generator configured to generate pipeline commands and transfer them to the syncDRAM memory such that a pipeline data transfer command is transferred to the syncDRAM memory in parallel with a primary command generated from the microprocessor and sent to the syncDRAM. This pipeline data transfer command is received by the syncDRAM through the same internal address latch used in response to a primary data transfer request. A pipeline arm generator is also provided to communicate with the pipeline request path and the data transfer controller to indicate that the syncDRAM interface is ready to transfer data in response to a pipeline request.

40 Claims, 7 Drawing Sheets

METHOD FOR PARALLEL PROCESSING OF DRAM READ REQUEST IN A MEMORY-CACHE CONTROLLER SYSTEM

BACKGROUND OF THE INVENTION

1. Field of the Invention

The present invention relates to data processing systems and, more particularly, to devices for performing data transfer in a computer system.

2. Description of Related Art

In conventional computer systems, data is processed by transferring and decoding instructions, such as from software programs, that define operations to be performed. Within these instructions are data transfer requests for transferring data throughout the computer system. These computer systems typically have extensive memory banks that take on a variety of characteristics. In particular, synchronous DRAM ("syncDRAM") memories are a modern advancement that provides DRAM capability where the outputs are referenced to the rising edge of the system clock pulse. Furthermore, when a read operation is performed, more than one word is loaded into a high speed shift register where these words are shifted out, one word per clock cycle. These multi-word transfers are called "bursts". As a result, a memory system built out of syncDRAMs has a peak (ideal) bandwidth equal to the system's clock frequency multiplied by the number of data lines in the system's bus. Therefore, the memory bandwidth is directly proportional to the clock frequency.

Modern syncDRAMs can deliver a burst of information of four to eight cycles of data, with the address word appearing first followed by the remainder of the block. This allows for a large amount of data to be transferred at the same rate as the system clock. Each burst of data is transferred in response to a primary request from a microprocessor, the primary request having a corresponding address that is latched in the syncDRAM with the command sent by the microprocessor. The primary request could also originate from the PCI master controller or any other peripheral controller sitting off of a PCI bridge.

In a typical data request from a syncDRAM, the host interface which interprets the system bus, or host bus, of the computer system sends a request out for data in response to a command from a microprocessor. The receiving unit in the system indicates its readiness to do the cycle requested by the host interface by asserting an ARM signal back to the system. The syncDRAM interface will begin to drive a cycle to SyncDRAM on the rising edge of the system clock in which both the ARM signal and the request signal from the host interface are sampled active together. A data transfer controller (sometimes referred to in the art as the B-unit) having buffer memory capable of storing addresses controls the transfer of data between the syncDRAM memory and the PCI bus. The data transfer controller provides an interface between the host interface, the syncDRAM memory and the peripheral component interface (PCI) of the system. With the added complexity in modern systems of additional data transfer request sources (other than the CPU) and maintaining cache coherency, the B-unit is crucial in modern computer systems. The data transfer controller provides for interface among these components, keeps track of what data is in the correct buffers and determines whether a certain cycle can start or if an ongoing cycle needs to be completed. The buffers in the data transfer controller store addresses and controls what cycles will occur and when.

The data transfer controller signals the readiness of the controller to allow the cycle by initiating an ARM signal or BHarm which indicates the readiness of the data transfer controller to accept the cycle requested by the host interface. This indicates that the data transfer controller is either idle or simply has the capacity to accept the cycle. After the transfer controller asserts BHarm, the receiving unit then can begin receiving data.

After the data has been requested and sent, the syncDRAM is then ready to latch another address in response to a data transfer request and begin a new cycle. From the time when the data is finished being delivered until a number of clocks corresponding to the CAS latency of the syncDRAM after the next request and address are received by the syncDRAM unit, a lag time occurs where no data is being transferred. Due to the CAS latency, the syncDRAM could receive a request on the clock after the last data was delivered and the result would still be a period of time equal to the CAS latency where no data is transferred. It would be useful during this time to continue transferring data from the syncDRAM unit. As will be seen, the present invention makes use of this time to transfer data from the syncDRAM unit in a simple, elegant manner.

SUMMARY OF THE INVENTION

The present invention, in one embodiment, provides a memory interface that is capable of extending the data burst in a syncDRAM memory so as to provide a continuous draw of data from the syncDRAM memory banks.

Continuous draw of data from the syncDRAM unit is accomplished by providing a second pipeline between the host interface and the syncDRAM memory to provide secondary data requests that are executed in parallel with primary requests that are received from the data transfer controller.

The system generally consists of a host interface interfacing with the host bus of the computer system, a data transfer controller for controlling data transfer from the host interface to the syncDRAM memory and a memory interface for interfacing between the syncDRAM memory and the data transfer controller. The data transfer controller is essentially the same as in conventional systems, however, it is used as a conduit for transferring the parallel pipelined data requests from the host interface to the memory interface. The parallel requests are automatically treated as a single transaction by the data transfer controller. The request that will be executed in parallel with the primary requests will take advantage of the already opened address latches of the primary request as described below.

A key element of the invention is that a feedback mechanism is used to signal the host interface when the memory interface has latched the addressed for the primary request, enabling the host interface to open address latches so that the next CPU read address will flow through immediately to the syncDRAM memory interface. Since the pipelined requests are an add-on protocol of asserting the primary request, the data transfer controller does not need to reroute the pipelined requests.

Once the data transfer has begun transfer from the syncDRAM unit in response to the primary request, the pipeline request is asserted in order to direct further data located in the syncDRAM unit to be transferred out immediately after the data corresponding to the primary request. As a result, continuous retrieval of data from the syncDRAM unit is achieved. Accordingly, a memory interface is provided in one embodiment that is faster than conventional systems and that eliminates wait states between data retrievals to consecutive read requests.

DETAILED DESCRIPTION OF THE PREFERRED EMBODIMENT

FIGS. 1 through 9 of the drawings disclose various embodiments of the present invention for purposes of illustration. One skilled in the art will recognize alternative embodiments that may be employed without departing from the principles of the invention that are illustrated by the structures and methods described herein.

Figure 1:
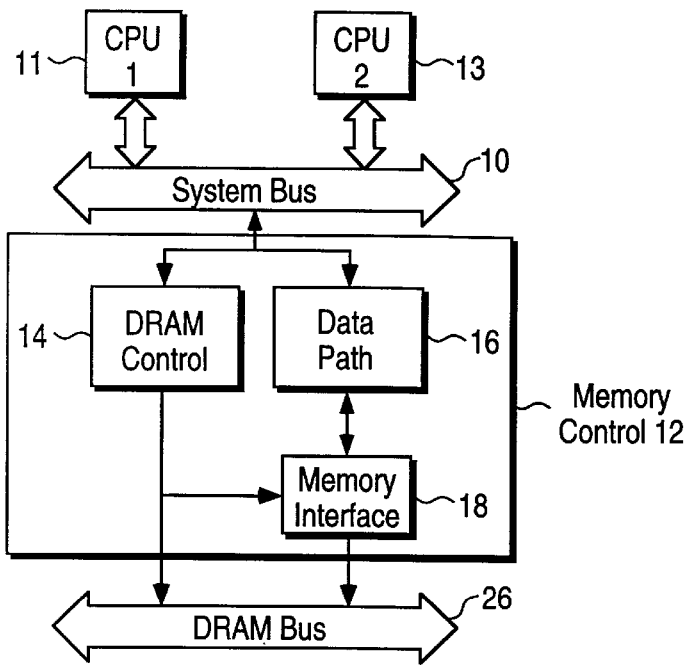
FIG. 1 is a general block diagram of a data retrieving unit in a conventional computer system.
Figure 2:
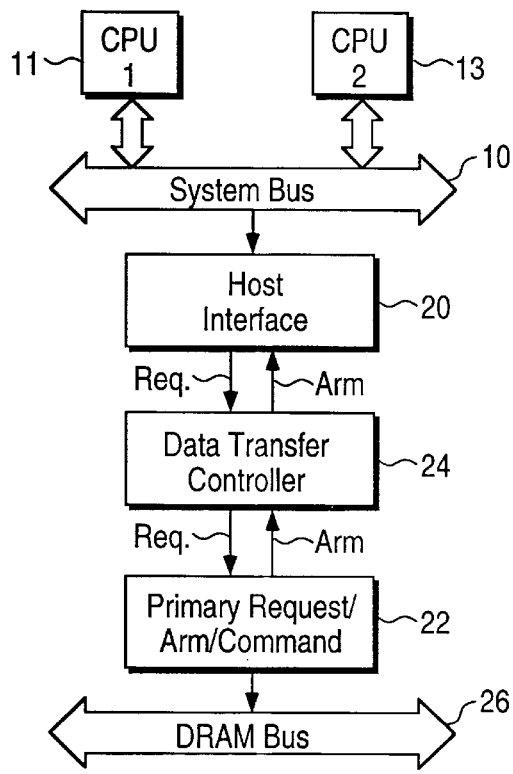
FIG. 2 is a general block diagram of a data retrieval unit having a memory interface in accordance with the present invention.

In accordance with one embodiment of the present invention, the memory controller is implemented in a pipelined, microprocessor computer system. As shown generally in FIG. 1, the computer system is comprised of a system bus 10 that can be connected to one or more microprocessors (CPU's) 11,13 that issue commands for transferring data, a memory control 12 that includes a DRAM control 14, a data path 16 and a memory interface 18, with the memory control connected to a DRAM bus 26 configured to transmit control signals to the DRAM memory. FIG. 2 shows a conventional DRAM control arrangement that includes a host interface 20 that interprets commands from the system bus, a DRAM interface 22 that interprets commands for the syncDRAM memory and a data transfer controller 24 that acts as an interface among the host interface, the DRAM interface and the system bus.

Figure 8:
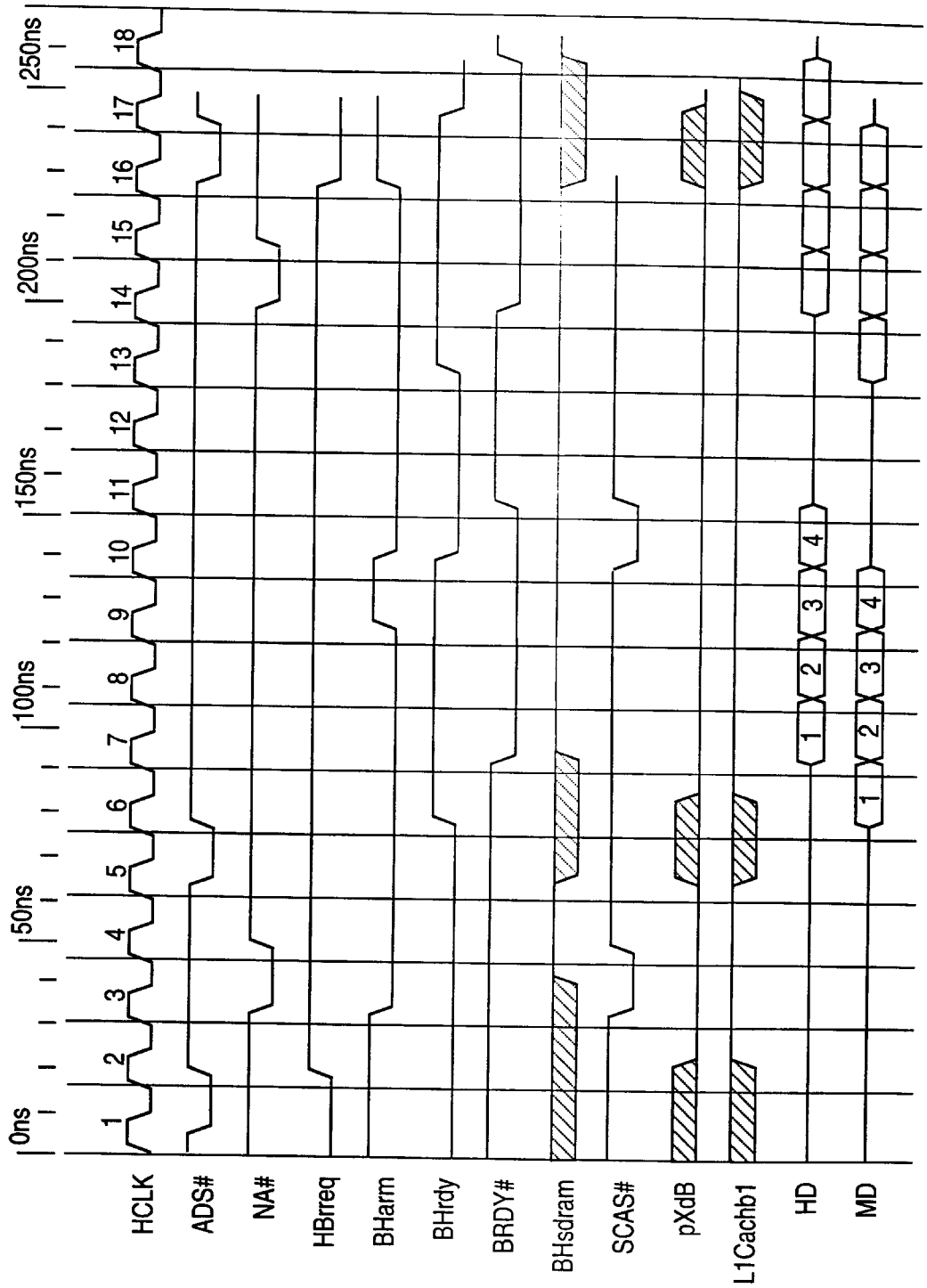
FIG. 8 is a time diagram of a conventional back to back data transfer from a syncDRAM memory.

The systematic function of a typical data transfer in a syncDRAM is illustrated in the timing diagram of FIG. 8. The host interface receives data transfer commands from the system bus that may have originated from a microprocessor in the system. The request causes NA# shown in clock 3 of FIG. 8 which in turn causes ADS# to occur in clock 5. Conventional memory controllers would have generally asserted NA# in clock 7, permitting ADS# in clock 9. This would push HBrreq re-assertion to clock 10 and SCAS for the second cycle to clock 11. There are two reasons why NA# would not be driven in conventional systems. First, with Fast Page or EDO DRAM for example, no benefit could be achieved by having the next CPU read request available at an earlier time. Second, if an asynchronous SRAM were to be used as a tag RAM in a system with an L2 cache, the address for the first read would have to be kept on the host address bus long enough to update the tag. In one embodiment of the present invention, making the next read request available at an earlier time allows for its pipelined assertion to the syncDRAM without waiting.

The host interface, when called upon to initiate a signal, produces a request command or HBREQ and sends it to the data transfer controller. The data transfer controller indicates its readiness to do the cycle request by asserting an ARM command or BHarm to the host interface 20. A data transfer cycle will begin on a clock in which both an ARM and an REQ are sampled active together. The BHarm signal indicating the readiness of the data transfer controller to accept the cycle is a result of the data transfer controller being idle or simply having the capacity to accept the cycle. The BHarm signal is removed after both the REQ and ARM are active, indicating that the data transfer controller has received the signal and is busy working on that cycle. A BHRDY signal is then asserted by the B unit indicating that data is being transferred. The BHRDY signal is an active high signal that is then deasserted after the data has been retrieved on a retrieving bus indicated as MD. A BRDY signal is then asserted when the data is moved from the MD bus to the host bus or HD and is deasserted when the data has been transferred to the system bus. In the conventional system, the syncDRAM then waits for further requests to retrieve data. As can be seen by the HD and MD timeline, the time between the BHarm signal and the BHRDY signal is three clock signals. This corresponds to the syncDRAM's CAS latency of three. The present invention, including the embodiment described herein, will work with any CAS latency programmed in the system. The CAS latency is a design characteristic of the syncDRAM memory unit and is a factor in the syncDRAM memory unit's efficiency. As can be seen in the HD and MD bus timeline, there are three clock cycles between each burst of data delivered between commands.

Figure 5:
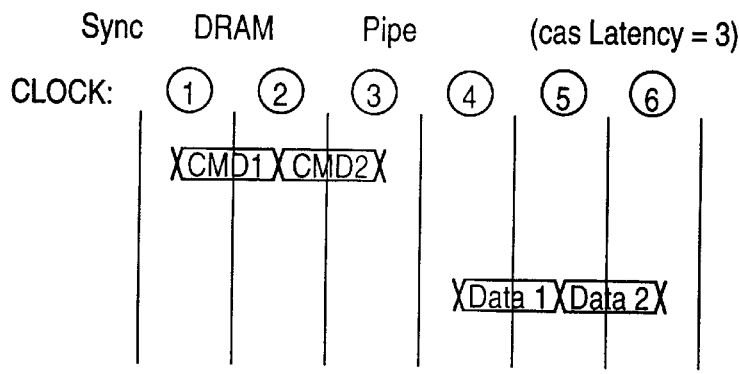
FIG. 5 is a time diagram of a conventional data transfer from a syncDRAM.
Figure 6:
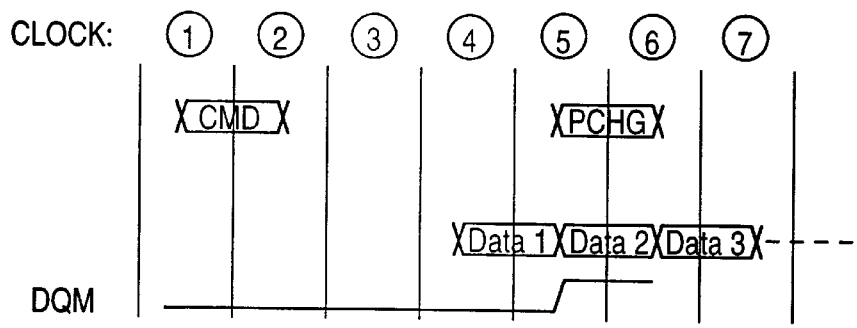
FIG. 6 is a time diagram of a conventional data transfer from a syncDRAM.
Figure 7:
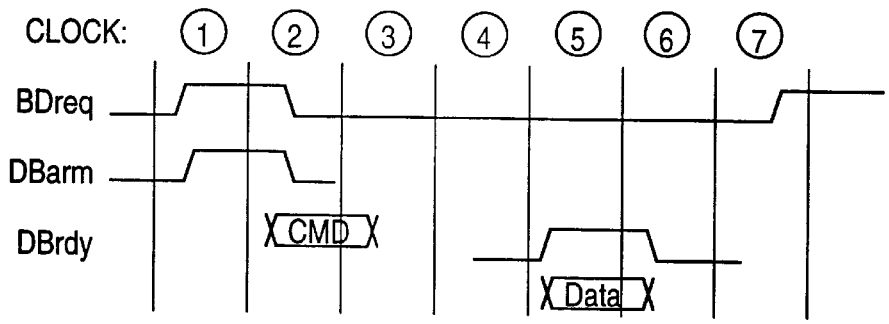
FIG. 7 is a time diagram of a conventional data request from a syncDRAM memory.

As shown in FIG. 5, the syncDRAM delivers data is response to commands three clock cycles after the command is asserted, assuming an syncDRAM CAS latency of 3, and delivers blocks of data that correspond to each command in the same order that the commands are received in the syncDRAM unit. As illustrated in FIG. 6, a precharge command (PCHG) in this case is asserted after the data request command. The precharge command is not always driven after the data request command. The precharge command is analogous to RAS deassertion in an EDO system to close a page. The syncDRAM can accept a second command without a precharge, but the access must be to the same page. This PCHG command determines whether the last data word in the block is valid and must be deasserted before a second command can be accepted by the syncDRAM. As shown in FIG. 7, once the BDreq and DBarm signals are both active, a command is sent to the syncDRAM with the data being delivered three clock cycles later while the DBrdy signal is active. Once BDreq and DBarm signals are active, a command is driven to the syncDRAM unit. The syncDRAM can still receive commands while DBrdy is asserted. In one embodiment, BDreq, DBarm and DBrdy are internal to the host bridge. DBrdy is the SyncDRAM interface unit's indication to the data transfer controller that data is available on the MD. The data transfer controller will pass this information on to the host bus via BHrdy as it transfers the data from MD to HD. In one embodiment, the CMD illustrated in FIG. 7 shows the fastest assertion of a read command in the event of a page hit.

Figure 3:
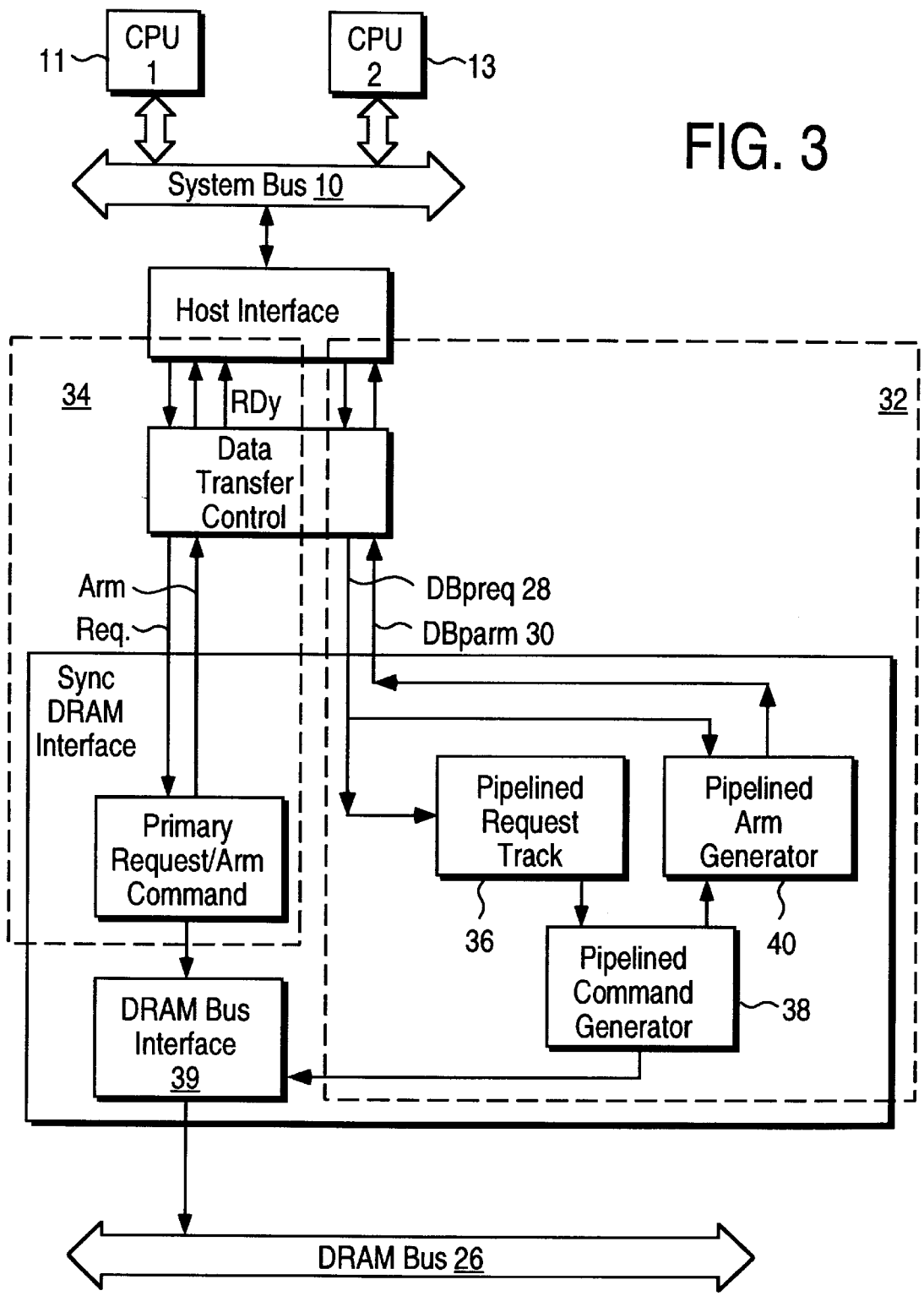
FIG. 3 is a general block diagram of a portion of a memory interface in accordance with one embodiment of the present invention.

FIG. 3 illustrates one embodiment of the present invention that is configured to allow data transfer requests that can be performed in parallel with primary data transfer requests asserted by the host interface. The computer system that utilizes the embodiment shown in FIG. 3 utilizes the same system bus as the conventional system in FIG. 2 along with the same microprocessor or microprocessors. The host interface is essentially the same but includes a parallel path including a Preq path 28 for transmitting pipelined parallel requests and a Parm path 30 for transmitting pipelined ARM commands that indicate the readiness of the DRAM interface to transmit a pipeline request.

As indicated in FIG. 3, the data path 32 flows from the host interface to the DRAM bus through the data transfer controller and the syncDRAM interface. The pipeline path that runs parallel with the primary path 34 flows through the host interface, the data transfer controller and the syncDRAM interface to the DRAM bus. The pipelined requests flow unmodified and uncontrolled through the data transfer controller to the syncDRAM interface for reasons that will be described later. Once in the syncDRAM interface, the commands in the path are processed in pipeline circuitry that produces the Parm and Preq request signals. The pipeline circuitry includes a pipeline request track 36 that routes the Preq signal to a pipeline command generator 38 for delivery to the syncDRAM interface 39 that receives both primary and pipelined commands and delivers them to the DRAM bus 26. The Parm signal is generated in a pipeline arm generator 40 in response to the pipeline command generator processing the pipeline requests. The Parm signal is delivered back to the host interface in a similar manner to the primary requests described above to indicate to the host interface that the syncDRAM interface is ready to the perform the parallel pipeline cycle corresponding to the pipeline request.

Figure 4:
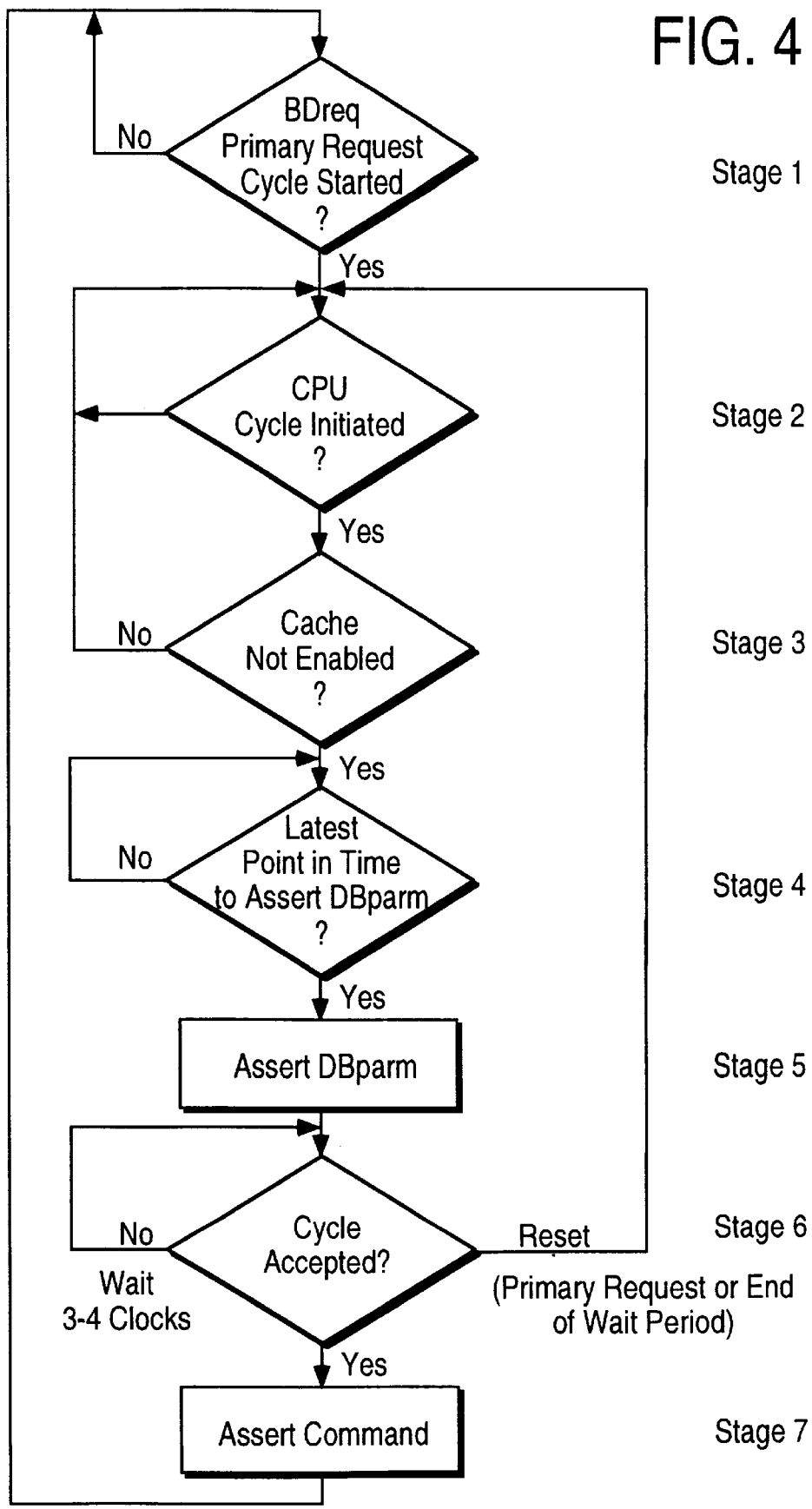
FIG. 4 is a flow diagram describing the data transfer function of a memory interface in accordance with one embodiment of the present invention.
Figure 9:
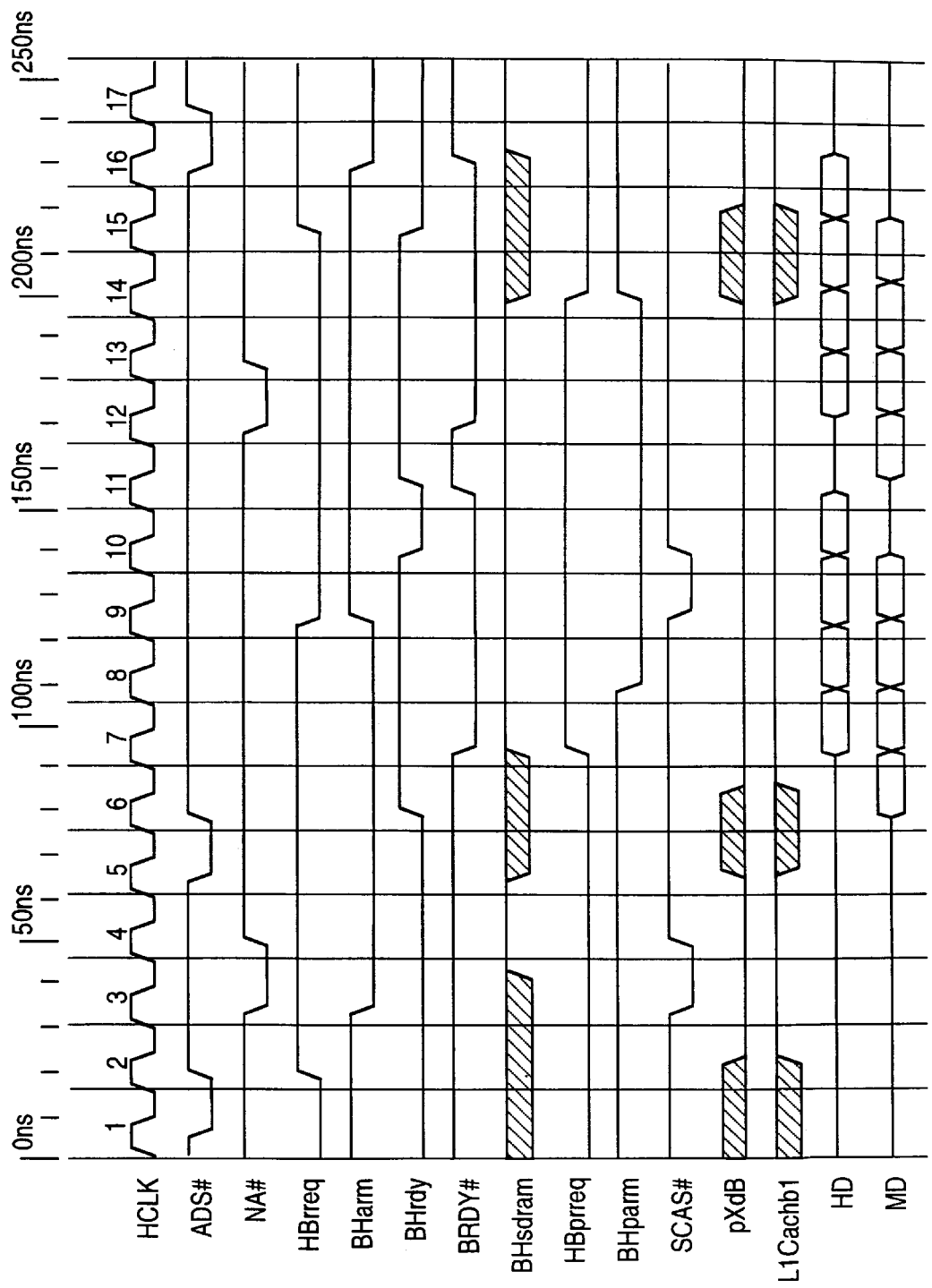
FIG. 9 is a time diagram of a back to back data transfer from a syncDRAM memory in accordance with one embodiment of the present invention.

The embodiment of FIG. 3 is best understood by its function which will be presented with reference to FIGS. 4 and 9. FIG. 4 illustrates a typical cycle performed during a data request driven by the host interface on behalf of the system bus in the form of HBrreq indicating a request for data from the host interface to the data transfer controller. This is a read request. From an idle state, HBreq is driven off of the clock edge of which #ADS is sampled. The read command to the syncDRAM can then be driven on the following clock. HBreq is driven by the host interface after sampling #ADS driven by the CPU on the external system bus 10.

Beginning with stage 1 in FIG. 4, a primary request is asserted that begins the cycle.

Figure 10:
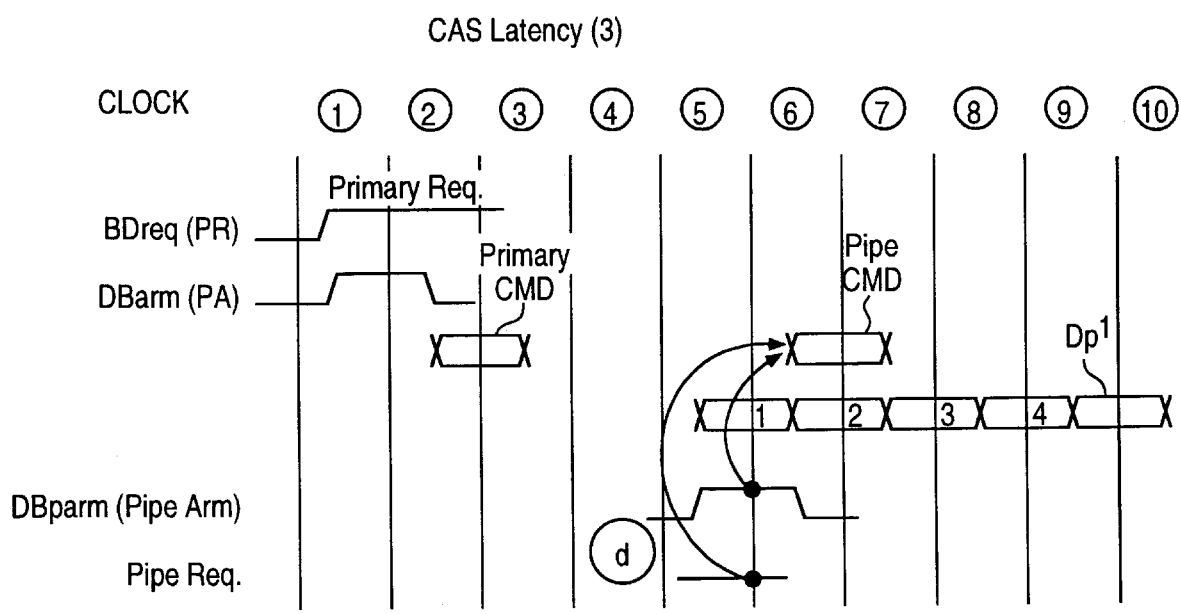
FIG. 10 is a time diagram of a back to back data transfer from a syncDRAM memory in accordance with one embodiment of the present invention.

In stage two, the system safeguards the request by requiring a BDreq that is from the CPU. The pipeline request follows the primary request as shown in FIG. 9, so that the pipeline data can immediately follow the data corresponding to the primary request. When the primary request is ultimately received in the syncDRAM, the syncDRAM latches the address associated with the command automatically so that the command will be associated with the data received. Once the HBreq command has been passed to the syncDRAM interface as BDreq and the syncDRAM interface has stored the address, the host interface allows its latches to open so that the next address to be used can flow through. When the DBparm command along with the pipeline request command are active as shown in FIG. 10, the pipeline command can be asserted. This command is asserted three clock periods (these three clocks corresponding to a CAS latency of 3) before the end of the data associated with the primary command, so that the data corresponding to the pipeline request Dp1 will immediately follow the data corresponding to the primary command at the output of the syncDRAM unit.

The initiation of the syncDRAM unit is done by the data transfer controller allocating the cycle to the syncDRAM unit. Since the pipeline request is a read request that is sent immediately after another read request, the primary request, rerouting of the request by the data transfer controller is not needed. It must be kept in mind that the pipelined or secondary request is independent of the primary request. Their execution, however, is coordinated by use of the pipelined request along with the pipelined ARM command as described above when there is a primary request for a read followed by a second read request, both targeted to the syncDRAM. The pipelined request will typically be to a different address than the primary request and a separate command will be driven to the syncDRAM on behalf of the pipelined request. The separate command corresponds to the second SCAS in FIG. 9.

In stage 3, the system assures that a cache memory is not enabled during a request to the syncDRAM. The present invention in this embodiment, due to the NA# restrictions mentioned above, requires that the pipelined read requests be disabled any time an L2 cache is enabled. This is generally configuration dependent and is not required for this or other embodiments of the present invention to operate.

In stage 4, the flow diagram indicates that the timing of the pipeline requests must be such that the pipeline command must occur at a certain point and time in order to be asserted in parallel with a primary request.

In one embodiment, the pipelined or secondary request (HBpreq, BDpreq) must occur before the primary request (HBrreq, BDreq) has been deasserted due to impending completion of the transfer of read data. This is because once HBrreq and BDreq have been deasserted, there is no advantage to using the pipelined req/arm over simply using the primary req/arm pair again. Therefore, it is more simple to restrict the control logic as to when HBpreq and BDpreq can be used. Also, there is no waiting to assert HBpreq or BDpreq since they are driven as soon as the host interface decodes a CPU read that is targeted to the syncDRAM. Depending on how far along the first read is, the syncDRAM interface may need to delay driving SCAS for the next read command until the second data block from the first read is on the MD bus, in order for it to not interfere with the first read from the syncDRAM. This corresponds to a CAS latency of 3. If, for example, a CAS latency of 2 were chosen, SCAS would be delayed until the third data block. If the request were earlier, a CAS latency of 3 would put the first data for the pipelined read on the MD bus instead of the last data for the primary read on the MD bus, which would be improper.

Referring now to FIG. 10, the pipeline command is shown at a location that is prior to the end of the data retrieved from the syncDRAM unit. The pipeline command should occur before the end of the data retrieval cycle for the primary requests so that the pipeline command can deliver the data corresponding to the pipeline requests immediately after the data retrieved from the primary request. This will ensure the faster burst rate. However, there is nothing preventing the pipeline command from happening later. This may even be required in the event information is not available to request a data burst. Even in the latter scenario, clock savings are still achieved as long as the system can assert the pipeline command on time for some portion of the data request cycles. Asserting the pipeline command three cycles—with a CAS latency of three—before the end of the block of data corresponding to the primary request is considered safe and optimum. If the pipeline command is received after this point, it is not processed in parallel with the current primary request and becomes the next primary request.

Assertion of the DBarm in stage 5 of FIG. 4 while the pipeline request is active will force the address latches open that are associated with the primary request. Assertion of DBarm indicates that the data transfer controller of FIG. 3 has latched the address and allows latches in the host interface to open for the next cycle address to begin to flow through the path so that the data transfer controller can begin to decode the address. Once the data transfer controller has latched the address for the primary cycle, the pipelined request may be driven. Therefore, the pipeline request must also be asserted late enough to allow the primary cycle to finish, but early enough to allow the data corresponding to the pipeline request to immediately follow the data corresponding to the primary request. As discussed above, clock savings will still be recognized. Since the primary and pipeline request are sharing the address latches, address corruption is avoided by opening the address latches at a non-critical time for the pipeline address. Since the syncDRAM internally latches the address with the commands and automatically increments to give out a burst of four sets of data, it is necessary to assert the pipeline command, the actual command on the syncDRAM bus, after the data has begun to be retrieved onto the MD bus so that the data corresponding to the pipeline request will immediately follow. While the data is being received onto the MD bus, it is flopped onto the host bus HD, one clock later. This is illustrated in FIG. 9.

In stage 6, the system waits for a pipeline request. Stages 4 and 5 set up the system to be ready to receive a pipeline request, however, if a host request has not been driven soon enough, the next host request will be driven as a primary request. In that case, the system is automatically reset. If the cycle is accepted at stage 6, and a pipeline command is found, the command is asserted and the data is retrieved in parallel with the corresponding primary request.

Having the pipeline data immediately follow the primary request data assures a consistent flow of data from the syncDRAM, or, as coined in the art, a 1-1-1 burst rate from the syncDRAM. This feature, however, is not required for the present invention to operate. For example, suppose that after ADS#, NA# is driven for the first cycle and the syncDRAM read begins. Also, suppose the CPU does not have a second read request immediately, but does drive ADS# for a read before the syncDRAM read is finished. In this case, benefit is still derived from using the parallel req/arm mechanism rather than waiting for the first req/arm pair to be available. However, since the CPU started the cycle late, everything occurs later, which, for example, could result in a 7-1-1-1-3-1-1-1-1 pair of burst reads.

The BHrdy signal corresponds to the HD bus. The DBrdy signal corresponds to the MD or host bus.

From the above description, it will be apparent that the invention disclosed herein provides a novel and advantageous device and method for parallel processing of syncDRAM read requests in a memory-cache controller.

As will be understood by those familiar with the art, the invention may be embodied in other specific forms without departing from its spirit or essential characteristics, and thus, the described embodiment is not restrictive of the scope of the invention. The following claims are indicative of the scope of the invention, and all variations which come within the meaning and range of equivalency of the claims are to be embraced within their scope.

What is claimed is:

1. A memory interface to control a memory device, the memory interface to receive pipelined data transfer requests from an outside source and latch an internal address, comprising:

a pipelined request track to receive a pipelined data transfer request from an outside source;

a pipelined command generator to receive a pipelined data transfer request from the pipelined request track and to generate commands to control the memory device, wherein a pipelined data transfer command is transferred to the memory device in parallel with a primary command from the outside source and received by the memory device through the same internal address latch used for the primary command; and a pipelined arm generator to communicate with the pipelined request track and the outside source and to generate an arm signal indicating that the memory interface is ready to start the transfer.

2. The interface according to claim 1 wherein the outside source is a pipelined microprocessor for generating primary data transfer requests and pipelined data transfer requests, wherein data is continuously transferred between a destination device and the memory device in response to a primary request followed by a pipelined request.

3. The interface according to claim 1 wherein the outside source is a pipelined microprocessor for generating primary data transfer requests and pipelined data transfer requests, wherein data is continuously transferred from the memory device in response to a primary read request followed by a pipelined read request.

4. The interface according to claim 1 wherein the outside source is a pipelined microprocessor for generating primary data transfer requests and pipelined data transfer requests, wherein data is continuously transferred to the memory device in response to a primary write request followed by a pipelined write request.

5. The interface according to claim 4 wherein the pipelined request track receives the pipelined data transfer request originating from the pipelined microprocessor through an intermediate bus bridge.

6. The interface according to claims 2 or 5 further comprising:

a data transfer controller to control whether data can transfer between the memory device and a destination device; and a host interface to communicate with the pipelined microprocessor and the data transfer controller and to generate a primary data transfer request in response to a first data transfer request from the microprocessor to transfer data between the memory device and a destination device and to generate a parallel pipelined data transfer request in response to a second data transfer request from the microprocessor.

7. The interface according to claim 6 wherein the host interface generates pipelined commands in response to a primary status signal from the memory interface indicating that the address for the primary request has been latched and the pipeline address can now be driven.

8. The controller according to claim 7 wherein the data transfer controller allows data transfer to begin between the memory device and a destination device when the primary status signal and a primary request signal are asserted together.

9. The interface according to claim 8 wherein the data transfer controller allows data to be transferred in response to the pipelined data transfer request when a secondary status signal from the memory interface is asserted indicating that the memory device is able to transfer data.

10. A computer system comprising:
a pipelined microprocessor configured to generate data transfer requests;
a data transfer controller configured to communicate with the pipelined microprocessor;
a syncDRAM type memory (syncDRAM) configured to communicate with the data transfer controller;
a host interface configured to communicate with the pipelined microprocessor and the data transfer controller and configured to generate a primary data transfer request in response to a first data transfer request from the microprocessor to transfer data between the syncDRAM and a destination device and configured to generate a parallel pipelined data transfer request in response to a second data transfer request from the microprocessor;
wherein the data transfer controller is configured to communicate among the host interface, the data transfer controller and the syncDRAM by interpreting data transfer commands received from the host interface and sending them to the syncDRAM; and
a memory interface configured to interface the syncDRAM and the host interface and configured to generate a pipelined command for execution in the syncDRAM in response to parallel pipelined data transfer requests from the host interface in parallel with the primary data transfer commands generated by the host interface.

11. The computer system according to claim 10 wherein data is continuously transferred between a destination device and the syncDRAM in response to a primary request followed by a pipelined request.

12. The computer system according to claim 10 wherein data is continuously transferred from the syncDRAM in response to a primary read request followed by a pipelined read request.

13. The computer system according to claim 10 wherein data is continuously transferred to the syncDRAM in response to a primary write request followed by a pipelined write request.

14. The computer system according to claim 10 or 13 wherein the memory interface receives the pipelined data transfer request originating from the pipelined microprocessor through an intermediate host interface.

15. The computer system according to claim 14 wherein the host interface generates pipelined commands in response to a primary status signal originating from the syncDRAM interface indicating that the address for the primary request has been latched and the pipeline address can now be driven.

16. The computer system according to claim 15 wherein the data transfer controller allows data to transfer between the syncDRAM and a destination device when a secondary status signal is asserted.

17. The computer system according to claim 16 wherein the data transfer controller allows data to be transferred in response to the pipelined data transfer request when the secondary status signal is asserted from the syncDRAM.

18. In a computer system having a pipelined microprocessor that communicates with a peripheral component interface (PCI) bus, a memory system controller, a host interface, a memory interface, a syncDRAM type memory (syncDRAM) having a chip select that is externally enabled, a data transfer controller and a syncDRAM interface, a method of processing data transfer requests in parallel comprising:
generating a first data transfer request with the microprocessor to transfer data between the host interface and the syncDRAM memory;
generating a second data transfer request with the microprocessor to transfer data between the host interface and the syncDRAM memory;
producing a primary data transfer request with the host interface for the syncDRAM memory in response to the first data transfer request from the microprocessor;
producing a parallel data transfer request with the host interface for the syncDRAM memory in response to the second data transfer request;
latching an internal address in the syncDRAM memory in response to the primary data transfer request;
transferring the primary data transfer request to the syncDRAM memory at the latched address; and
transferring the parallel data transfer request in parallel with the primary data transfer request to the syncDRAM memory.

19. The method according to claim 18 further comprising the steps of:
transferring a first set of data from a first address in the syncDRAM memory to a destination device in response to the primary data transfer request; and
transferring a second set of data from a second address in the syncDRAM memory to a destination device in response to the parallel data transfer request.

20. The method according to claim 19 wherein, in the event of a row or page miss cycle, transferring the second set of data is accomplished by asserting a precharge command to the syncDRAM memory at a point in time during the transfer of the first set of data.

21. A syncDRAM type memory (syncDRAM) interface to control a syncDRAM, the syncDRAM interface to receive primary data transfer requests from a microprocessor and latch an internal address, comprising:
a pipelined path means to receive a pipelined data transfer request from an outside source;
a pipelined command generating means to communicate with the pipelined path means and to receive a pipelined data transfer request from the pipelined path means and to generate commands to control a syncDRAM memory, wherein a pipelined data transfer command is transferred to the syncDRAM in parallel with a primary command from microprocessor and received by the syncDRAM through the same internal address latch in response to the primary command; and
a pipelined arm generating means to communicate with the pipelined path means and the microprocessor and to generate ready commands indicating that the syncDRAM is ready to transfer data.

22. The interface according to claim 21 wherein data is continuously transferred between a destination device and the syncDRAM in response to a primary request followed by a pipelined request.

23. The interface according to claim 21 wherein data is continuously transferred from the syncDRAM in response to a primary read request followed by a pipelined read request.

24. The interface according to claim 21 wherein data is continuously transferred to the syncDRAM in response to a primary write request followed by a pipelined write request.

25. The interface according to claim 24 wherein the pipelined path means receives the pipelined data transfer request originating from a pipelined microprocessor through intermediate bus bridge means.

26. The interface according to claims 22 or 25 further comprising:
   data transfer controller means configured to control whether data can transfer between the syncDRAM memory and a destination device; and
   host interface means configured to communicate with the pipelined microprocessor and the data transfer controller means and configured to generate a primary data transfer request in response to a first data transfer request from the microprocessor to transfer data between the syncDRAM and a destination device and configured to generate a parallel pipelined data transfer request in response to a second data transfer request from the microprocessor.

27. The interface according to claim 26 wherein the host interface means generates pipelined commands in response to a primary ARM signal originating from the syncDRAM interface indicating that the address for the primary request has been latched and the pipeline address can be driven.

28. The controller according to claim 27 wherein the data transfer controller allows data to transfer between the syncDRAM and a destination device when the secondary ARM signal is asserted.

29. The interface according to claim 28 wherein the data transfer controller means allows data to be transferred in response to the pipelined data transfer request when a secondary ARM signal is asserted from the syncDRAM.

30. A computer system comprising:
   a pipelined microprocessor configured to generate data transfer requests;
   data transfer controller means configured to communicate with the pipelined microprocessor;
   a syncDRAM type memory (syncDRAM) configured to communicate with the data transfer controller means;
   host interface means configured to communicate with the pipelined microprocessor and the data transfer controller means and configured to generate a primary data transfer request in response to a first data transfer request from the microprocessor to transfer data between the syncDRAM and a destination device and configured to generate a parallel pipelined data transfer request in response to a second data transfer request from the microprocessor;
   syncDRAM interface means configured to interface the syncDRAM and the data transfer controller means and configured to generate a pipelined command for execution in the syncDRAM in response to parallel pipelined data transfer requests from the host interface in parallel with the primary data transfer commands generated by the host interface.

31. The computer system according to claim 30 wherein data is continuously transferred between a destination device and the syncDRAM in response to a primary request followed by a pipelined request.

32. The computer system according to claim 30 wherein data is continuously transferred from the syncDRAM in response to a primary read request followed by a pipelined read request.

33. The computer system according to claim 30 wherein data is continuously transferred to the syncDRAM in response to a primary write request followed by a pipelined write request.

34. The computer system according to claim 30 or 33 wherein the pipelined request track is configured to receive the pipelined data transfer request originating from the pipelined microprocessor through an intermediate host interface.

35. The computer system according to claim 34 wherein the host interface means generates pipelined commands in response to a primary ARM signal originating from the syncDRAM interface indicating that the address for the primary request has been latched and the pipeline address can be driven.

36. The according to claim 35 wherein the data transfer controller means allows data to transfer between the syncDRAM and a destination device when the secondary ARM signal is asserted.

37. The computer system according to claim 36 wherein the data transfer controller means allows data to be transferred in response to the pipelined data transfer request when a secondary ARM signal is asserted.

38. In a computer system having a pipelined microprocessor that communicates with a peripheral component interface (PCI) bus, a memory system controller, a host interface, a memory interface, a syncDRAM type memory (syncDRAM), a data transfer controller and a syncDRAM interface, a method of processing pipelined data transfer requests in parallel with primary data transfer requests, comprising:
   latching an internal address of the syncDRAM in response to a primary data transfer request;
   transferring the primary data transfer request to the syncDRAM at the latched address; and
   transferring the parallel data transfer request in parallel with the primary data transfer request to the syncDRAM.

39. The method according to claim 38 further comprising the steps of:
   transferring a first set of data from a first address in the syncDRAM to a destination device in response to the primary data transfer request; and
   transferring a second set of data from a second address in the syncDRAM to a destination device in response to the parallel data transfer address.

40. The method according to claim 19 wherein transferring the second set of data is accomplished by asserting a precharge command to the syncDRAM at a point in time during the transfer of the first set of data.

* * * * *